United States Patent [19]

Mihashi et al.

[11] Patent Number: 4,667,332
[45] Date of Patent: May 19, 1987

[54] SEMICONDUCTOR LASER ELEMENT SUITABLE FOR PRODUCTION BY A MO-CVD METHOD

[75] Inventors: Yutaka Mihashi, Nishinomiya; Yutaka Nagai, Itami, both of Japan

[73] Assignee: Mitsubishi Denki Kabushiki Kaisha, Tokyo, Japan

[21] Appl. No.: 700,017

[22] Filed: Feb. 8, 1985

[30] Foreign Application Priority Data

Mar. 13, 1984 [JP] Japan ................................ 59-49734

[51] Int. Cl.$^4$ ............................................. H01S 3/19
[52] U.S. Cl. ....................................... 372/45; 372/46; 357/17
[58] Field of Search ................ 372/45, 46, 44; 357/17

[56] References Cited

U.S. PATENT DOCUMENTS 4,480,331 10/1984 Thompson ........................... 372/45

OTHER PUBLICATIONS

"Visible GaAlAs V-Channeled Substrate Inner Stripe Laser with Stabilized Mode Using p-GaAs Substrate", S. Yamamoto et al, Applied Physics Letters, vol. 40, pp. 372 to 374.
"Single-Longitudinal-Mode cw Room-Temperature $Ga_{1-x}Al_xAs$—GaAs Channel-Guide Lasers Grown by Metal Organic Chemical Vapour Deposition", by R. D. Dupuis et al, Applied Physics Letters, vol. 33, pp. 724 to 726.

Primary Examiner—James W. Davie
Attorney, Agent, or Firm—Birch, Stewart, Kolasch & Birch

[57] ABSTRACT

A semiconductor laser element includes a first cladding layer of first conductivity type provided on a semiconductor substrate of the first conductivity type; a current blocking layer of a second conductivity type provided on the first cladding layer having a stripe groove from which the first cladding layer and is exposed at the bottom thereof; a light guide layer of the first conductivity type provided covering the current blocking layer, the stripe groove, and the first cladding layer exposed from the groove; an active layer provided on the light guide layer curved in the neighborhood of the stripe groove, whose refractive index is larger than that of the light guide layer; and a second cladding layer of the second conductivity type provided on the active layer, whose refractive index is smaller than that of the active layer.

9 Claims, 6 Drawing Figures

SEMICONDUCTOR LASER ELEMENT SUITABLE FOR PRODUCTION BY A MO-CVD METHOD

FIELD OF THE INVENTION

The present invention relates to a semiconductor laser, and especially to that whose structure is suitable for production by the Metal Organic Chemical Vapour Deposition method (hereinafter referred to as the "MO-CVD method").

BACKGROUND OF THE INVENTION

Recently, the MO-CVD method has gained attention as a method for producing a semiconductor laser element by crystal growth. The MO-CVD method is a method whereby crystal growth is executed by utilizing a kind of thermal decomposition with the metal organic of a group III element such as trimethyl gallium and trimethyl aluminum, and a material that includes a group V element, such as arsine ($AsH_3$) gas, as the main raw material. This method is superior in view of the uniformity of film thickness and the quality of grown film, and furthermore in view of capability of executing a crystal growth on a large-sized wafer. Therefore, this method is advantageous as a mass-production method of laser crystals, and it is expected that the conventional liquid phase growth technique should be replaced thereby. However, even in this MO-CVD method, there is a disadvantage that it is difficult to grow the crystallization so as to embed a groove. This unfavourably restricts laser structures to which this MO-CVD method can be applied. For example, this method is not applicable to the production of a refractive index guide type semiconductor laser where a GaAs substrate is provided with a groove, a double hetero-structure is laminated embedding the groove, and an effective light guide is constructed in such a manner that the light is absorbed by the portions of the substrate located at the both sides of the groove, a configuration that is realized by a liquid phase growth method. The MO-CVD method is mainly utilized in a so-called gain guide structure laser element where the light is guided by the gain distribution in the horizontal direction, without any structure as a refractive index guide in the horizontal direction of the active layer.

However, such a gain guide type laser element has disadvantages in that it requires a large operational current and a large astigmatism relative to the refractive index guide type laser, and the latter type laser is more appropriate for practical use in view of typical life time of the device.

Another prior art semiconductor laser is reported in an article "Visible GaAlAs V-channeled substrate inner stripe laser with stabilized mode using p-GaAs substrate" by S. Yamamoto et al, Applied Physics Letters, vol. 40, p 372 to 374. The semiconductor laser of this article has an internal current confinement structure similar to that of the present invention.

Another prior art semiconductor laser is reported in "Single-longitudinal-mode CW room-temperature $Ga_{1-x}Al_xAs$-GaAs channel-guide lasers grown by metal organic chemical vapour deposition", by R. D. Dupuis and P. D. Dapkus, Applied Physics Letters, vol. 33, p 724 to 726. The semiconductor laser of this article has a groove or a channel at the lower portion of the active layer, and the active layer has a curved configuration similar to that of the present invention.

OBJECTS AND SUMMARY OF THE INVENTION

One object of the present invention is to provide a semiconductor laser which, having a novel structure suitable for being produced by a MO-CVD method, is capable of operating at a low current and has a small astigmatism.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor laser element where a first cladding layer and a current blocking layer provided with a stripe groove are provided on a substrate, and a light guide layer, a curved active layer, and a second cladding layer are produced on the current blocking layer and the groove respectively one after the other so that the curved portion of the active layer may have an effective light confining function in the horizontal direction.

DETAILED DESCRIPTION OF THE PREFERRED EMBODIMENTS

Figure 1:
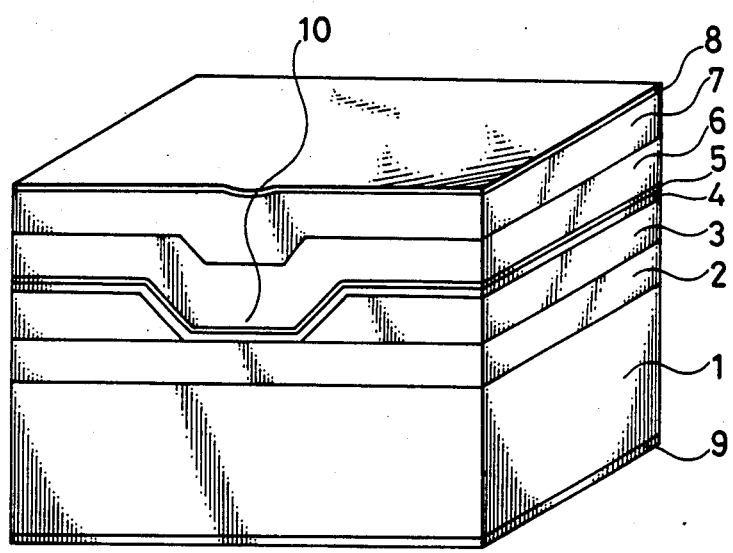
FIG. 1 is a diagram showing a perspective view of a semiconductor laser as an embodiment of the present invention.

Reference will now be made to FIG. 1 which shows a semiconductor laser element as one embodiment of the present invention.

In FIG. 1, the reference numeral 1 designates a P type GaAs substrate where P type impurities such as Zn are doped. The reference numeral 2 designates a P type $Al_xGa_{1-x}As$ cladding layer grown on the P type GaAs substrate 1. The numeral 3 designates an n type GaAs current blocking layer which is grown on the P type $Al_xGa_{1-x}As$ cladding layer 2. The current blocking layer 3 has a stripe groove 10 having a reverse trapezoid cross-section, and the cladding layer 2 is exposed from the stripe groove 10. The refractive index of the current blocking layer 3 is larger than that of the cladding layer 2, and the energy band gap thereof is smaller than that of the cladding layer 2. The reference numeral 4 designates a P type $Al_yGa_{1-y}As$ light guide layer produced on the n type current blocking layer 3 having the groove 10 so as to have a step configuration caused by the groove 10. The refractive index of the light guide layer 4 is larger than that of the cladding layer 2. The numeral 5 designates a P type or n type $Al_zGa_{1-z}As$ active layer provided on the light guide layer 4, and this active layer 5 has a larger refractive index than those of the adjacent layers. The numeral 6 designates an n type $Al_xGa_{1-x}As$ cladding layer produced on the active layer 5. The numeral 7 designates an n type GaAs contact layer provided on the cladding layer 6. This contact layer 7 is used for producing an electrode thereon. The thicknesses t of the layers and the composition proportions x, y, z of Al in the layers are decided, for example, as follows:

P-$Al_xGa_{1-x}As$ cladding layer 2: $t2 \approx 1.5$ μm, x=0.45.
P-$Al_yGa_{1-y}As$ light guide layer 4: $t4 \approx 0.2$ μm, y=0.30.
$Al_zGa_{1-z}As$ active layer 5: $t5 \approx 0.15$ μm, z=0.15.
n-$Al_xGa_{1-x}As$ cladding layer 6: $t6 \approx 1.5$ μm, x=0.45.

Such data make it possible to obtain a laser oscillation in a visible light region (wavelength of about 780 nm). The numeral 8 designates an electrode provided on the n type GaAs contact layer 7, and the numeral 9 designates an electrode provided on the P type GaAs substrate.

The process for manufacturing the laser of FIG. 1 will be described with reference to FIGS. 2(a) to 2(e).

Figure 2A:
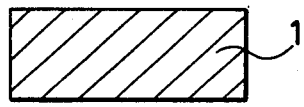
FIGS. 2(a) to 2(e) is a diagram showing cross-sectional views of the process for manufacturing the device of FIG. 1.
Figure 2B:
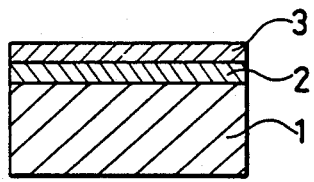
Figure 2C:
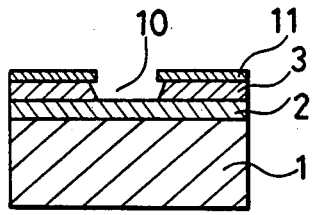
Figure 2D:
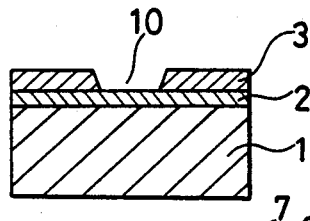
Figure 2E:
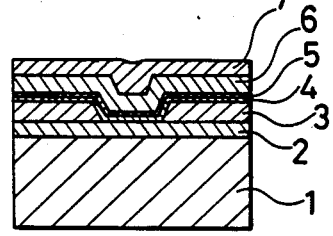

At first, the P type $Al_xGa_{1-x}As$ cladding layer 2 and the n type GaAs current blocking layer 3 are produced in the above-mentioned order on the P type GaAs substrate 1 shown in FIG. 2(a) by using a MO-CVD method. Thereafter, an etching using a selective etching solution capable of etching GaAs faster than AlGaAs is executed on the n type GaAs current blocking layer 3 using the photo resist 11 as an etching mask to produce a stripe groove 10 as shown in FIG. 2(c). For example, a mixed solution of hydrogen peroxide and ammonia in a proportion of 30 to 1 can be used as the selective etching solution. The stripe groove 10 is desirable to have a width of 3 to 4 μm at its top and a width of 2 μm at its bottom. Subsequently, the photo resist 11 is removed as shown in FIG. 2(d), a predetermined preprocessing is executed to the product, and the P type $Al_yGa_{1-y}As$ light guide layer 4, the $Al_zGa_{1-z}As$ active layer 5, the n type $Al_xGa_{1-x}As$ cladding layer 6, and the n type GaAs contact layer 7 are successively produced by using MO-CVD methods as shown in FIG. 2(e).

In this embodiment the laser structure is constructed by two stages of crystal growths, and as the second growth it is necessary to grow the $Al_yGa_{1-y}As$ light guide layer 4 on the surface of the $Al_xGa_{1-x}As$ cladding layer 2 exposed from the bottom of the stripe groove 10. Generally, it is difficult to grow an AlGaAs or GaAs layer by crystallization on an AlGaAs layer exposed once to an oxidizing atmosphere by a conventional liquid phase growth technique. However, it is possible to grow the $Al_yGa_{1-y}As$ light guide layer 4 on the $Al_xGa_{1-x}As$ cladding layer 2 by a MO-CVD method. It is also possible to make the active layer 5 have a curved configuration analogous to the cross-section of the stripe groove 10, and the curved portion of such a configuration functions as an effective light confinement structure in a horizontal direction.

The principle of operation of the semiconductor laser of the present invention will be described in the following:

When a positive and a negative voltage are applied to the P type electrode 9 and the n type electrode 8, respectively, a current does not flow in the region where the n type GaAs current blocking layer 3 exists between both electrodes 8 and 9 because the pn junction constituted by the n type GaAs current blocking layer 3 and the p type $Al_yGa_{1-y}As$ light guide layer 4 is reverse biased, and a current flows concentrated only in the neighborhood of the aperture of the stripe groove 10. Then, holes and electrons are injected from the P type $Al_yGa_{1-y}As$ light guide layer 4 and from the n type $Al_xGa_{1-x}As$ cladding layer 6, respectively, to the portion of $Al_zGa_{1-z}As$ active layer 5 which portion is located close to the bottom of the stripe groove 10. In these circumstances, when the level of the injected current increases, a stimulated emission begins, leading to a laser oscillation. Thus, the active layer 5 has a curved configuration analogous to the cross-section of the stripe groove 10, and the portion of the active layer 5 between that portion of the active layer that is parallel with the bottom of the groove 10 and the inclined portion of the active layer on the side wall of the current blocking layer 3 operates an effective refractive index guide in a horizontal direction. Accordingly, the light is effectively confined in the portion of the active layer 5 parallel with the bottom of the groove 10.

Under the semiconductor laser of such construction, it is possible to oscillate the device at quite a small current relative to conventional gain guide lasers. Furthermore, the laser of the present invention has an effective refractive index guide in a horizontal direction, and has only a small astigmatism, and is thus appropriate for practical use. Furthermore, there is provided the $Al_yGa_{1-y}As$ light guide layer 4 between the active layer 5 and the p type $Al_xGa_{1-x}As$ cladding layer 2, and the refractive index of the light guide layer 4 is set at a value between those of the active layer 5 and the cladding layer 2. This makes it possible to make light extrude from the active layer 5 to the light guide layer 4, whereby the light density in the active layer 5 is reduced, resulting in an enhancement of the maximum light output of the laser. This gives rise to the possible realization of a high power semiconductor laser. When the composition proportion y of Al in the $Al_yGa_{1-y}As$ light guide layer 4 is made equal to the composition proportion x of Al in the $Al_xGa_{1-x}As$ cladding layer 2, it is, of course, possible to obtain a device which executes a usual laser operation although a high output cannot be obtained.

In the above illustrated embodiment, a p type GaAs substrate is used to grow layers comprising AlGaAs thereon, but an n type GaAs substrate can be employed to grow layers comprising AlGaAs which has opposite conductivity types thereon. An InP substrate can be employed instead of the GaAs substrate, and then a double hetero-structure is produced using a four-element compound such as InGaAsP.

As evident from the foregoing description, according to the present invention a light guide layer, a curved active layer, and a second cladding layer are produced respectively one after the other on a current blocking layer having a stripe groove at its center so that the curved portion of the active layer may have an effective light confining function in the horizontal direction. This structure provides a semiconductor laser element that is suitable for being produced by a MO-CVD method. It also enables mass-production of a semiconductor laser element which has a low operational current and a small astigmatism.

What is claimed is:

1. A semiconductor element for a semiconductor laser device, which comprises:
   a first cladding layer of a first conductivity type provided on a semiconductor substrate of said first conductivity type;
   a current blocking layer of a second conductivity type provided on said first cladding layer having a stripe groove which exposes a portion of said first cladding layer;
   a light guide layer of said first conductivity type provided covering said current blocking layer, said stripe groove, and the exposed portion of said first cladding layer;

an active layer provided on said light guide layer and conforming to the shape of said stripe groove whose refractive index is larger than a refractive index of said light guide layer; and a second cladding layer of second conductivity type provided on said active layer, whose refractive index is smaller than that of said active layer.

2. The semiconductor element as defined in claim 1, wherein the refractive index of said light guide layer is larger than that of said first cladding layer and smaller than that of said active layer.

3. A semiconductor element for a semiconductor layer device, comprising:

a first cladding layer of a first conductivity type of $Al_xGa_{1-x}As$ As provided on a substrate of said first conductivity type; p1 a current blocking layer of a second conductivity type provided on said first cladding layer and having a stripe groove which exposes a portion said first cladding layer;

a light guide layer of said first conductivity type of $Al_yGa_{1-y}As$ As provided covering said current blocking layer, said stripe groove and said exposed portion of said first cladding layer;

an active layer of $Al_zGa_{1-z}As$ provided on said light guide layer and conforming to the shape of said stripe groove, said active layer having a refractive index that is larger than a refractive index of said light guide layer; and a second cladding layer of said second conductivity type of $Al_xGa_{1-x}As$ provided on said active layer, said second cladding layer having a refractive index that is less than said refractive index of said active layer.

4. The semiconductor element of claim 3, wherein said refractive index of said light guide layer is larger than a refractive index of said first cladding layer.

5. The semiconductor element of claim 3 wherein x, y, and z satisfy the following equation:

$$z<y<x.$$

6. The semiconductor element of claim 3 wherein said current blocking layer has an energy band gap less than an energy band gap of said first cladding layer.

7. The semiconductor element of claim 3 wherein said first cladding layer has a thickness of approximately 1.5 μm, said light guide layer has a thickness of approximately 0.2 μm, said active layer has a thickness of approximately 0.15 μm, and said second cladding layer has a thickness of approximately 1.5 μm.

8. The semiconductor element of claim 3 wherein x is approximately equal to 0.45, y is approximately equal to 0.30 and z is approximately equal to 0.15.

9. The semiconductor element of claim 3 wherein said striped groove has a bottom width at said first cladding layer of 2 μm and a top width of 4 μm.

* * * * *